(12) United States Patent
Oganesian

(10) Patent No.: US 9,054,013 B2
(45) Date of Patent: Jun. 9, 2015

(54) METHOD OF MAKING 3D INTEGRATION MICROELECTRONIC ASSEMBLY FOR INTEGRATED CIRCUIT DEVICES

(71) Applicant: Optiz, Inc., Palo Alto, CA (US)

(72) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 0 days.

(21) Appl. No.: 14/013,980

(22) Filed: Aug. 29, 2013

(65) Prior Publication Data

US 2014/0004646 A1 Jan. 2, 2014

Related U.S. Application Data

(62) Division of application No. 13/157,193, filed on Jun. 9, 2011, now Pat. No. 8,546,900.

(51) Int. Cl.
*H01L 21/00* (2006.01)
*H01L 27/146* (2006.01)
(Continued)

(52) U.S. Cl.
CPC .......... *H01L 27/1469* (2013.01); *H01L 23/147* (2013.01); *H01L 23/49827* (2013.01); *H01L 21/486* (2013.01); *H01L 23/5389* (2013.01); *H01L 24/19* (2013.01); *H01L 24/20* (2013.01); *H01L 24/32* (2013.01); *H01L 24/45* (2013.01); *H01L 24/48* (2013.01); *H01L 24/73* (2013.01); *H01L 27/14618* (2013.01); *H01L 2224/04105* (2013.01); *H01L 2224/32225* (2013.01);
(Continued)

(58) Field of Classification Search
CPC .................................................. H01L 27/1469

USPC ....... 438/66, 98, 108; 257/433, E31.117, 734
See application file for complete search history.

(56) References Cited

U.S. PATENT DOCUMENTS 6,191,952 B1 * 2/2001 Jimarez et al. ................ 361/771
6,737,750 B1 * 5/2004 Hoffman et al. .............. 257/777
(Continued)

FOREIGN PATENT DOCUMENTS

| CN | 1244728 A | 2/2000 |
|---|---|---|
| CN | 101232033 A | 7/2008 |
| TW | 200629442 A | 8/2006 |

OTHER PUBLICATIONS

U.S. Appl. No. 13/157,202, filed Jun. 2011, Oganesian.
(Continued)

*Primary Examiner* — Phuc Dang
(74) *Attorney, Agent, or Firm* — DLA Piper LLP (US)

(57) ABSTRACT

A microelectronic assembly for packaging/encapsulating IC devices, which includes a crystalline substrate handler having opposing first and second surfaces and a cavity formed into the first surface, a first IC device disposed in the cavity and a second IC device mounted to the second surface, and a plurality of interconnects formed through the crystalline substrate handler. Each of the interconnects includes a hole formed through the crystalline substrate handler from the first surface to the second surface, a compliant dielectric material disposed along the hole's sidewall, and a conductive material disposed along the compliant dielectric material and extending between the first and second surfaces. The compliant dielectric material insulates the conductive material from the sidewall. The second IC device, which can be an image sensor, is electrically coupled to the conductive materials of the plurality of interconnects. The first IC can be a processor for processing the signals from the image sensor.

11 Claims, 6 Drawing Sheets

(51) Int. Cl.
*H01L 23/14* (2006.01)
*H01L 23/498* (2006.01)
*H01L 21/48* (2006.01)
*H01L 23/538* (2006.01)
*H01L 23/00* (2006.01)

(52) U.S. Cl.
CPC ............... *H01L2224/45144* (2013.01); *H01L 2224/45147* (2013.01); *H01L 2224/48227* (2013.01); *H01L 2224/73265* (2013.01); *H01L 2224/73267* (2013.01); *H01L 2924/3011* (2013.01); *H01L 2924/01047* (2013.01)

(56) References Cited

U.S. PATENT DOCUMENTS

| | | | |
|---|---|---|---|
| 6,777,767 | B2 | 8/2004 | Badehi |
| 6,972,480 | B2 | 12/2005 | Zilber et al. |
| 7,033,664 | B2 | 4/2006 | Zilber et al. |
| 7,157,742 | B2 | 1/2007 | Badehi |
| 7,192,796 | B2 | 3/2007 | Zilber et al. |
| 7,265,440 | B2 | 9/2007 | Zilber et al. |
| 7,495,341 | B2 | 2/2009 | Zilber et al. |
| 7,642,629 | B2 | 1/2010 | Zilber et al. |
| 2001/0002625 | A1* | 6/2001 | Fujii et al. ............... 174/262 |
| 2004/0251525 | A1 | 12/2004 | Zilber |
| 2005/0104179 | A1 | 5/2005 | Zilber |
| 2005/0205977 | A1 | 9/2005 | Zilber |
| 2006/0071342 | A1 | 4/2006 | Umemoto |
| 2007/0138498 | A1 | 6/2007 | Zilber |
| 2007/0158787 | A1 | 7/2007 | Chanchani |
| 2007/0190691 | A1 | 8/2007 | Humpston |
| 2007/0190747 | A1 | 8/2007 | Humpston |
| 2008/0012115 | A1 | 1/2008 | Zilber |
| 2008/0017879 | A1 | 1/2008 | Zilber |
| 2008/0083976 | A1 | 4/2008 | Haba |
| 2008/0083977 | A1 | 4/2008 | Haba |
| 2008/0099900 | A1 | 5/2008 | Oganesian |
| 2008/0099907 | A1 | 5/2008 | Oganesian et al. |
| 2008/0116544 | A1 | 5/2008 | Grinman |
| 2008/0116545 | A1 | 5/2008 | Grinman |
| 2008/0136002 | A1* | 6/2008 | Yang ............... 257/686 |
| 2008/0150121 | A1 | 6/2008 | Oganesian |
| 2008/0174008 | A1* | 7/2008 | Yang et al. ............... 257/723 |
| 2008/0179497 | A1* | 7/2008 | Maniam et al. ......... 250/214 AL |
| 2008/0246136 | A1 | 10/2008 | Haba et al. |
| 2009/0072392 | A1 | 3/2009 | Dang et al. |
| 2009/0115047 | A1 | 5/2009 | Haba |
| 2009/0160065 | A1 | 6/2009 | Haba |
| 2009/0212381 | A1 | 8/2009 | Crisp |
| 2009/0224404 | A1* | 9/2009 | Wood et al. ............... 257/738 |
| 2010/0053407 | A1 | 3/2010 | Crisp |
| 2010/0225006 | A1 | 9/2010 | Haba |
| 2010/0230812 | A1 | 9/2010 | Oganesian |
| 2011/0012259 | A1 | 1/2011 | Grinman |
| 2011/0024899 | A1 | 2/2011 | Masumoto et al. |
| 2011/0031629 | A1 | 2/2011 | Haba |
| 2011/0033979 | A1 | 2/2011 | Haba |
| 2011/0049696 | A1 | 3/2011 | Haba |
| 2011/0133333 | A1* | 6/2011 | Kwon et al. ............... 257/737 |
| 2011/0186998 | A1* | 8/2011 | Wu et al. ............... 257/738 |
| 2011/0187007 | A1 | 8/2011 | Haba |
| 2012/0018863 | A1 | 1/2012 | Oganesian |
| 2012/0018868 | A1 | 1/2012 | Oganesian |
| 2012/0018893 | A1 | 1/2012 | Oganesian |
| 2012/0018894 | A1 | 1/2012 | Oganesian |
| 2012/0018895 | A1 | 1/2012 | Oganesian |
| 2012/0020026 | A1* | 1/2012 | Oganesian et al. ......... 361/707 |
| 2012/0068327 | A1 | 3/2012 | Oganesian |
| 2012/0068330 | A1 | 3/2012 | Oganesian |
| 2012/0068351 | A1 | 3/2012 | Oganesian |
| 2012/0068352 | A1 | 3/2012 | Oganesian |
| 2012/0194719 | A1* | 8/2012 | Churchwell et al. ......... 348/302 |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/312,826, filed Dec. 6, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
Office Action and Search Report dated May 29, 2014 corresponding to the related Taiwanese Patent Application No. 101118951.
Office Action dated Jun. 3, 2014 and Search Report dated May 23, 2014 corresponding to the related Chinese Patent Application No. 201110190703.1.

* cited by examiner

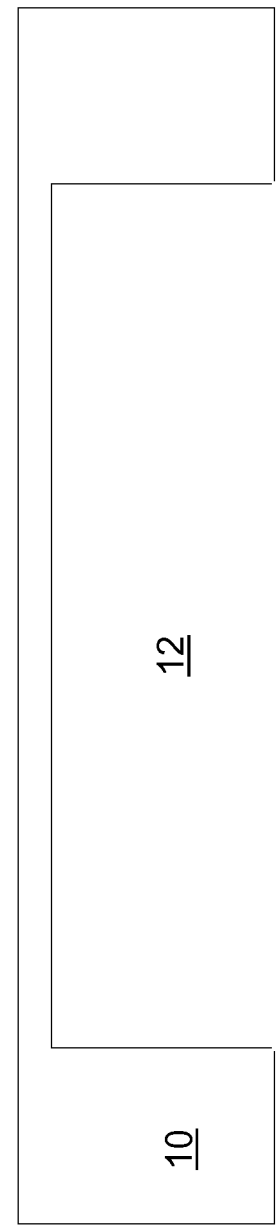

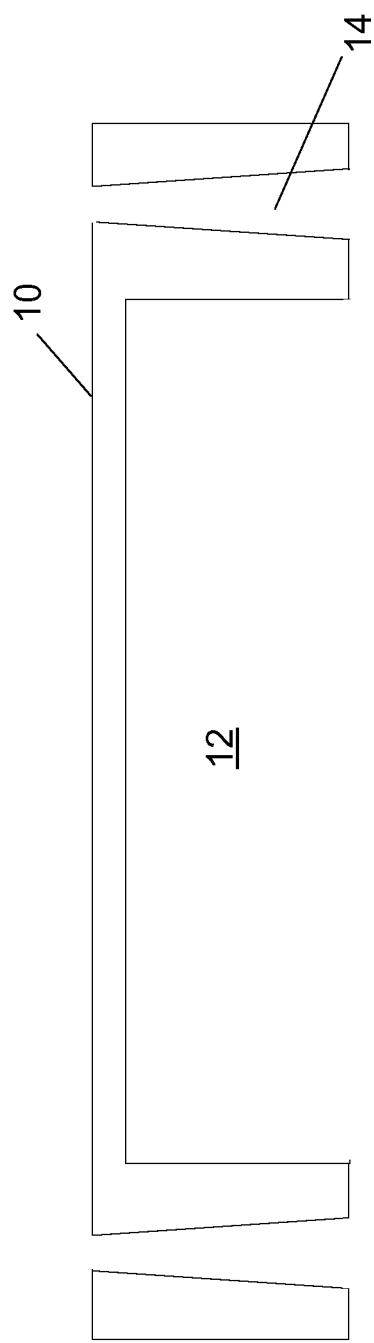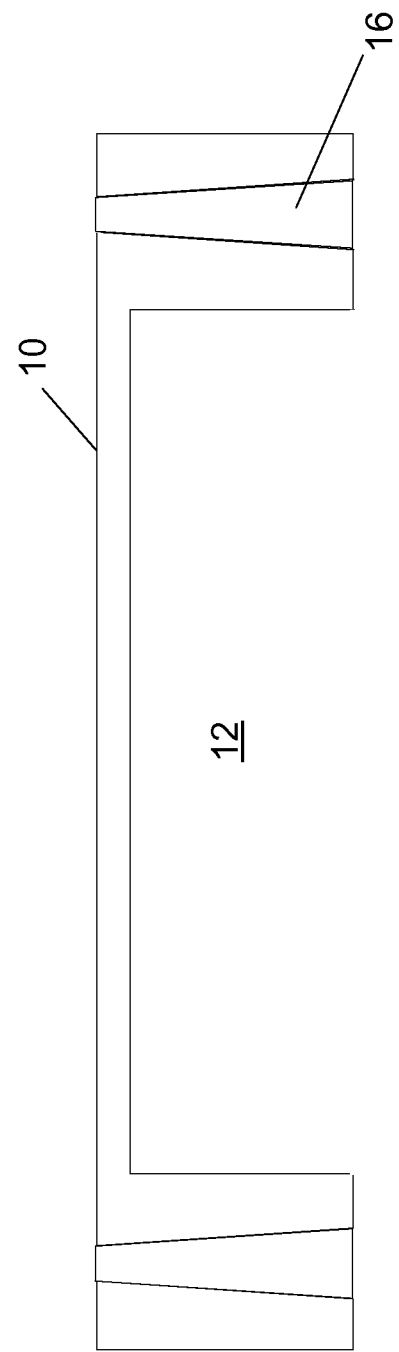

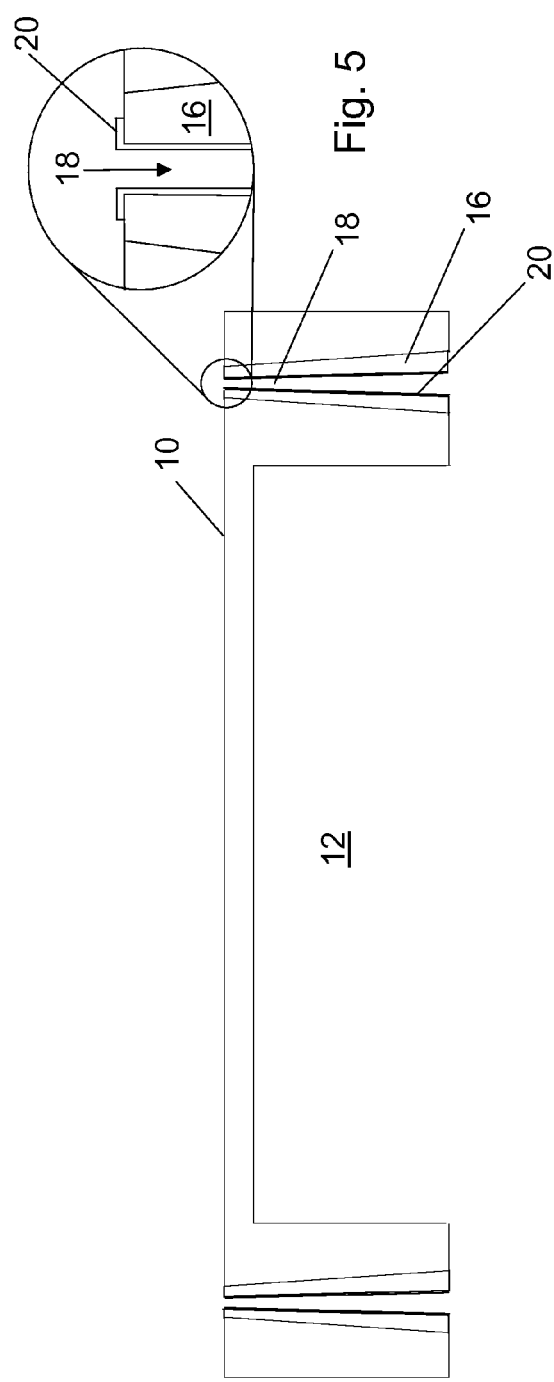
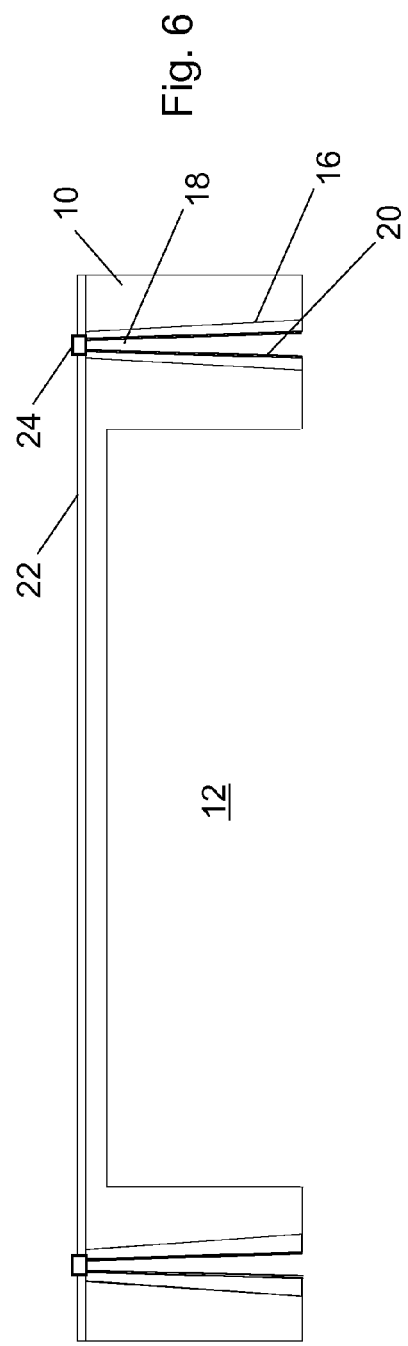

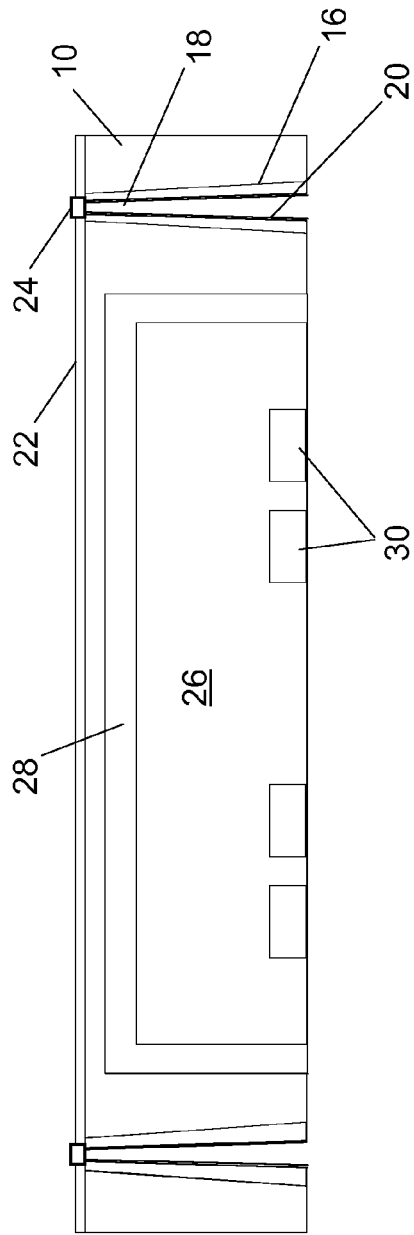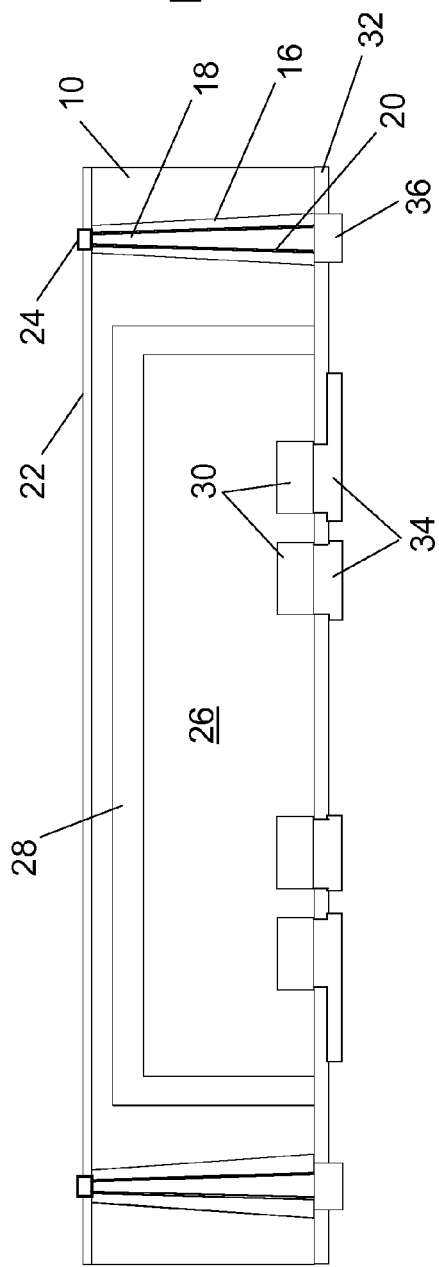

METHOD OF MAKING 3D INTEGRATION MICROELECTRONIC ASSEMBLY FOR INTEGRATED CIRCUIT DEVICES

RELATED APPLICATIONS

This application is a divisional of U.S. application Ser. No. 13/157,193, filed Jun. 9, 2011, U.S. Pat. No. 8,456,900.

FIELD OF THE INVENTION

The present invention relates to semiconductor packaging, and more particularly to a 3D integration package in which a semiconductor device is mounted on a package structure containing another semiconductor device.

BACKGROUND OF THE INVENTION

The trend for semiconductor devices is smaller integrated circuit (IC) devices (also referred to as chips), packaged in smaller packages (which protect the chip while providing off chip signaling connectivity). With related chip devices (e.g. an image sensor and its processor), one way to accomplish size reduction is to form both devices as part of the same IC chip (i.e. integrate them into a single integrated circuit device). However, that raises a whole host of complex manufacturing issues that can adversely affect operation, cost and yield. Another technique for combining related chip devices is 3D IC packaging, which saves space by stacking separate chips inside a single package.

3D packaging can result in increased density and smaller form factor, better electrical performance (because of shorter interconnect length which allows for increased device speed and lower power consumption), better heterogeneous integration (i.e. integrate different functional layers such as an image sensor and its processor), and lower cost.

However, 3D integration for microelectronics packaging faces challenges as well, such as high cost of 3D processing infrastructure and sustainable supply chain. Existing 3D IC packaging techniques to form through-silicon via's (TSV's), including Via-First, Via-Last and Via-middle processes, utilize semiconductor lithographic processes which are inherently complex and costly. As a result, few companies in the world can afford the billions of dollars in CMOS R&D per year to keep pace. Moreover, interconnects between IC packages can fail due to the stresses incurred during manufacturing and mounting, as well as thermal or vibrational stresses incurred during operation. A complementary, cost-effective TSV solution is needed to enable use of a separate but closely coupled image processor enabling the pixel array area on the image sensor to be maximized, and enable direct memory access, by stacking and vertically interconnecting multiple chips.

BRIEF SUMMARY OF THE INVENTION

A method of forming a microelectronic assembly includes forming a cavity in a crystalline substrate handler having opposing first and second surfaces, wherein the cavity is formed into the first surface that extends toward but does not reach the second surface, placing a first IC device in the cavity, mounting a second IC device to the second surface, and forming a plurality of interconnects through the crystalline substrate handler. Each of the plurality of interconnects is formed by forming a hole through the crystalline substrate handler with a sidewall extending between the first and second surfaces, forming a compliant dielectric material along the sidewall, and forming a conductive material along the compliant dielectric material and extending between the first and second surfaces, wherein the compliant dielectric material insulates the conductive material from the sidewall. The method further includes electronically coupling the second IC device to the conductive materials of the plurality of interconnects.

A method of forming a microelectronic assembly includes forming a cavity in a crystalline substrate handler having opposing first and second surfaces, wherein the cavity is formed into the first surface, placing a first IC device in the cavity, mounting a second IC device to the second surface, and forming a plurality of interconnects through the crystalline substrate handler. Each of the plurality of interconnects is formed by forming a hole through the crystalline substrate handler with a sidewall extending between the first and second surfaces, forming a compliant dielectric material along the sidewall, and forming a conductive material along the compliant dielectric material and extending between the first and second surfaces, wherein the compliant dielectric material insulates the conductive material from the sidewall. The method further includes electronically coupling the second IC device to the conductive materials of the plurality of interconnects, and forming one or more layers of insulation materials on the first surface that extends across an opening of the cavity in the first surface to encapsulate the first IC device in the cavity.

A method of forming a microelectronic assembly includes forming a cavity in a crystalline substrate handler having opposing first and second surfaces, wherein the cavity is formed into the first surface, placing a first IC device in the cavity, mounting a second IC device to the second surface, and forming a plurality of interconnects through the crystalline substrate handler. Each of the plurality of interconnects is formed by forming a hole through the crystalline substrate handler with a sidewall extending between the first and second surfaces, forming a compliant dielectric material along the sidewall, and forming a conductive material along the compliant dielectric material and extending between the first and second surfaces, wherein the compliant dielectric material insulates the conductive material from the sidewall. The method further includes electronically coupling the second IC device to the conductive materials of the plurality of interconnects. The second IC device is an image sensor and the first IC device is a processor for processing signals from the image sensor. The image sensor comprises an array of pixel sensors each including a photodetector for converting light energy to a voltage signal, and wherein the processor is configured to receive the voltage signals and to compute or interpolate color and brightness values for each of the voltage signals from the pixel sensors.

Other objects and features of the present invention will become apparent by a review of the specification, claims and appended figures.

BRIEF DESCRIPTION OF THE DRAWINGS

FIGS. 1-10 are cross sectional side views of a semiconductor packaging structure showing in sequence the steps in the processing of the packaging structure in the mounting of an IC device on a semiconductor packaging structure that houses another IC device.

DETAILED DESCRIPTION OF THE INVENTION

Figure 9:
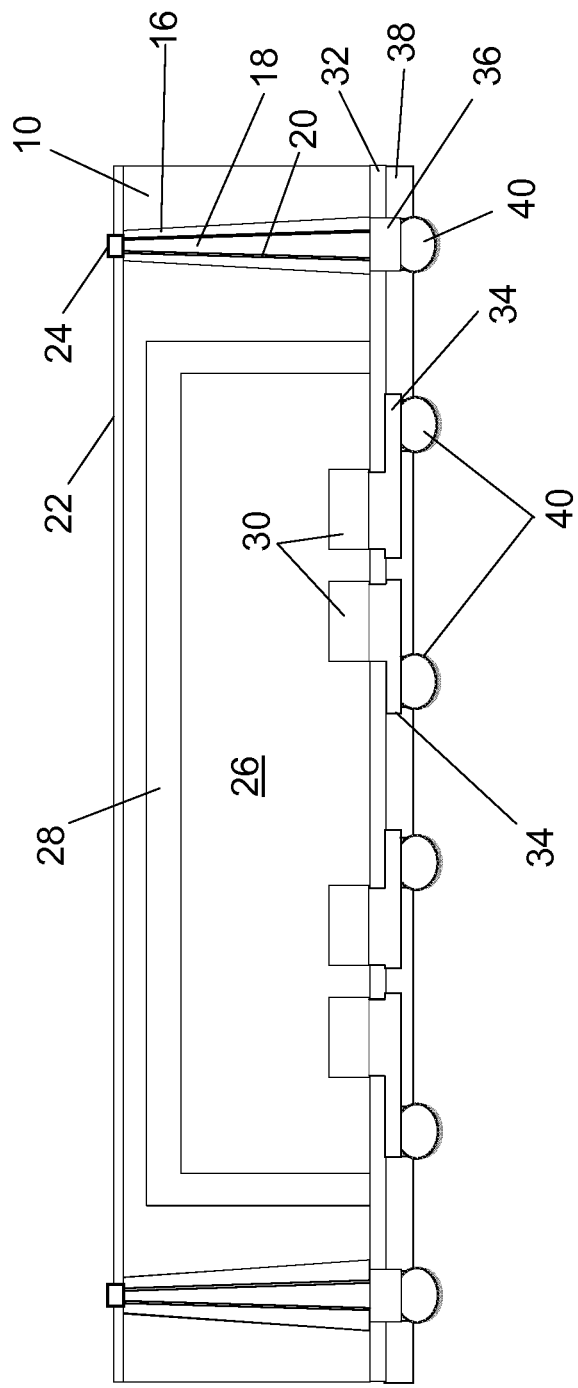

The present invention is wafer level 3D IC integration package solution that is ideal for packaging/encapsulating IC devices, and enables 3D integration of multiple related IC devices such as image sensors and their processors. The formation of the 3D integration package is described below.

The formation process begins with a crystalline substrate handler 10 as shown in FIG. 1. A non-limiting example can include a handler of crystalline substrate having a thickness of around 600 µm. A cavity 12 is formed in the handler, as shown in FIG. 2. Cavity 12 can be formed by the use of a laser, a plasma etching process, a sandblasting process, a mechanical milling process, or any other similar method. Preferably cavity 12 is formed by photo-lithography plasma etching, which includes forming a layer of photo resist on the handler 10, patterning the photo resist layer to expose a select portion of handler 10, and then performing a plasma etch process (e.g. using a SF6 plasma) to remove the exposed portion of the handler 10 to form the cavity 12. Preferably, the cavity extends no further than ¾ of the crystalline substrate thickness, or at least leaves a minimum thickness at the bottom of the cavity of around 50 µm. The plasma etch can be anisotropic, tapered, isotropic, or combinations thereof.

Through holes (via's) 14 are then formed through the thickness of the handler 10 adjacent to but connecting with the cavity 12, as illustrated in FIG. 3. Holes 14 can be formed using a laser, a plasma etching process, a sandblasting process, a mechanical milling process, or any similar method. Preferably, the through holes 14 are formed by plasma etching in a similar manner as the formation of the cavity 12 (except that the holes 14 extend all the way through the thickness of the crystalline substrate handler 10). Plasma silicon etching (e.g. anisotropic, tapered, isotropic, or combinations thereof) allows for various shapes of the via profile. Preferably, the profile of holes 14 is tapered, with a larger dimension at the surface through which cavity 12 was formed. Preferably the minimum hole diameter is around 25 µm, and the angles of the walls are between 5° and 35° relative to a direction perpendicular to the surfaces of the crystalline substrate through which the holes 14 are formed, such that the hole has a smaller cross-sectional size at one surface of the crystalline substrate 10 than the other surface.

The through holes 14 are then filled with a compliant dielectric material 16 as shown in FIG. 4, using a spin coating process, a spray process, a dispense process, an electrochemical deposition process, a lamination process, or any other similar method. A compliant dielectric is a relatively soft material (e.g. solder mask) that exhibits compliance in all three orthogonal directions, and can accommodate the coefficient of thermal expansion (CTE) mismatch between the crystalline substrate (~2.6 ppm/° C.) and Cu (~17 ppm/° C.) interconnect. Compliant dielectric material 16 is preferably a polymer, such as BCB (Benzocyclobutene), solder mask, solder resist, or BT epoxy resin.

Through holes 18 are then formed through the dielectric material 16. Holes 18 can be formed by using a $CO_2$ laser (e.g. spot size of about 70 µm) for larger sized holes 18, or a UV laser (e.g. spot size of about 20 µm at a wavelength of 355 nm) for smaller sized holes 18 (e.g. less than 50 µm in diameter). Laser pulse frequencies between 10 and 50 kHz at a pulse length of less than 140 ns can be used. The side walls of the through holes 18 are then metalized (i.e. coated with a metallization layer 20). The metallization process preferably starts with the desmear process for removing any resin smeared on the interior walls of the through holes 18 (caused by the drilling through dielectric materials such as epoxy, polyimide, cyanate ester resins, etc). The process involves contacting the resin smear with a mixture of gamma-butyrolactone and water to soften the resin smear, followed by treatment with an alkaline permanganate solution to remove the softened resin, and treatment with an aqueous acidic neutralizer to neutralize and remove the permanganate residues. After desmear treatment, the initial conductive metallization layer 20 is formed by electroless copper plating, followed by a photo-lithography etch back so that the metallization layer extends away from the holes 18 along dielectric 16 for a short distance (e.g. 25 µm or more) at both ends of holes 18 (but not so far as to make electrical contact with crystalline substrate 10. Adhesion is obtained at the plated interface by an anchor effect from the surface roughness. The resulting structure is shown in FIG. 5.

A dielectric layer 22 is then formed on the surface of the handler that does not contain the opening to cavity 12. Preferably, this is done by applying a photo-imagable dielectric on the handler surface by use of a spin coating process or a spray process. A photo-lithographic process (i.e. UV exposure, selective material removal) is then used to selectively remove portions of the dielectric layer 22 over (and thus exposing) through-holes 18 and horizontal portions of metallization layer 20. A metal layer is then sputtered over dielectric layer 22. A photo-lithographic process (i.e. resist layer deposition, UV exposure through a mask, removal of selected portions of resist to expose selected portions of metal layer, metal etching, and photo resist removal) is used to selectively remove portions of the metal layer leaving metal pads 24 disposed over through holes 18 and in electrical contact with metallization layer 20. The resulting structure is shown in FIG. 6. While not shown, the center of the metal pads 24 may have a small hole there through aligned with through-holes 18.

An IC chip 26 is inserted into cavity 12 as shown in FIG. 7. The IC chip 26 includes an integrated circuit (i.e. semiconductor device). The IC chip 26 is insulated from handler 10 by a dielectric insulating layer 28. The insertion of the IC chip 26 and formation of the insulating layer 28 can be performed in several ways. One way is to form the insulating layer 28 on the walls of the cavity 12 before insertion of the bare IC chip 26 (e.g. by spray coating epoxy, by electro-chemical deposition, etc.). A second way is to form the insulating layer 28 on the back surfaces of IC chip 26 before it is inserted into cavity 12. A third way is to form insulating layers both on the cavity walls and on the IC chip back surfaces before chip insertion, where the two insulating layers are bonded together upon chip insertion to form insulation layer 28. The IC chip 26 includes bonding pads 30 exposed on its bottom surface.

An encapsulation insulation layer 32 is then formed on the structure which encapsulates IC chip 26 inside cavity 12. Preferably, layer 32 is formed using a photo-imagable dielectric (e.g. a solder mask). The layer is pre-cured to partially remove solvent so the surface is not tacky. A photo lithography step is then performed (i.e. UV exposure through mask), after which select portions of the insulation layer 32 are removed to expose the IC chip bond pads 30 and the metallization layer 20 extending out of the through holes 18. Post curing can then be performed to increase the surface hardness of layer 32. A metal layer is then deposited over insulation layer 32 (e.g. by metal sputtering, followed by the deposition of a photo-imagable resist layer). A photo lithography step is then performed (i.e. UV exposure through mask and selective resist layer removal), followed by selective metal etching of those portions exposed by the photo resist removal, leaving metal fan-out and fan-in bond pads 34 in electrical contact with IC chip bond pads 30, and leaving interconnect bond pads 36 in electrical contact with the metallization layer 20 extending out of through holes 18. Metal plating of the bond pads 34/36 can occur here as well. The resulting structure is shown in FIG. 8 (after photo resist removal).

An encapsulation insulation layer 38 is then formed over insulation layer 32 and bond pads 34/36, followed by a selective etch back to expose bond pads 34/36. The selective etch back can be performed by a photo-lithographic process to selectively remove those portions of layer 38 over bond pads 34/36. BGA interconnects 40 are then formed on bond pads 34/36 using a screen printing process of a solder alloy, or by a ball placement process, or by a plating process. BGA (Ball Grid Array) interconnects are rounded conductors for making physical and electrical contact with counterpart conductors, usually formed by soldering or partially melting metallic balls onto bond pads. The resulting structure is shown in FIG. 9.

Figure 10:
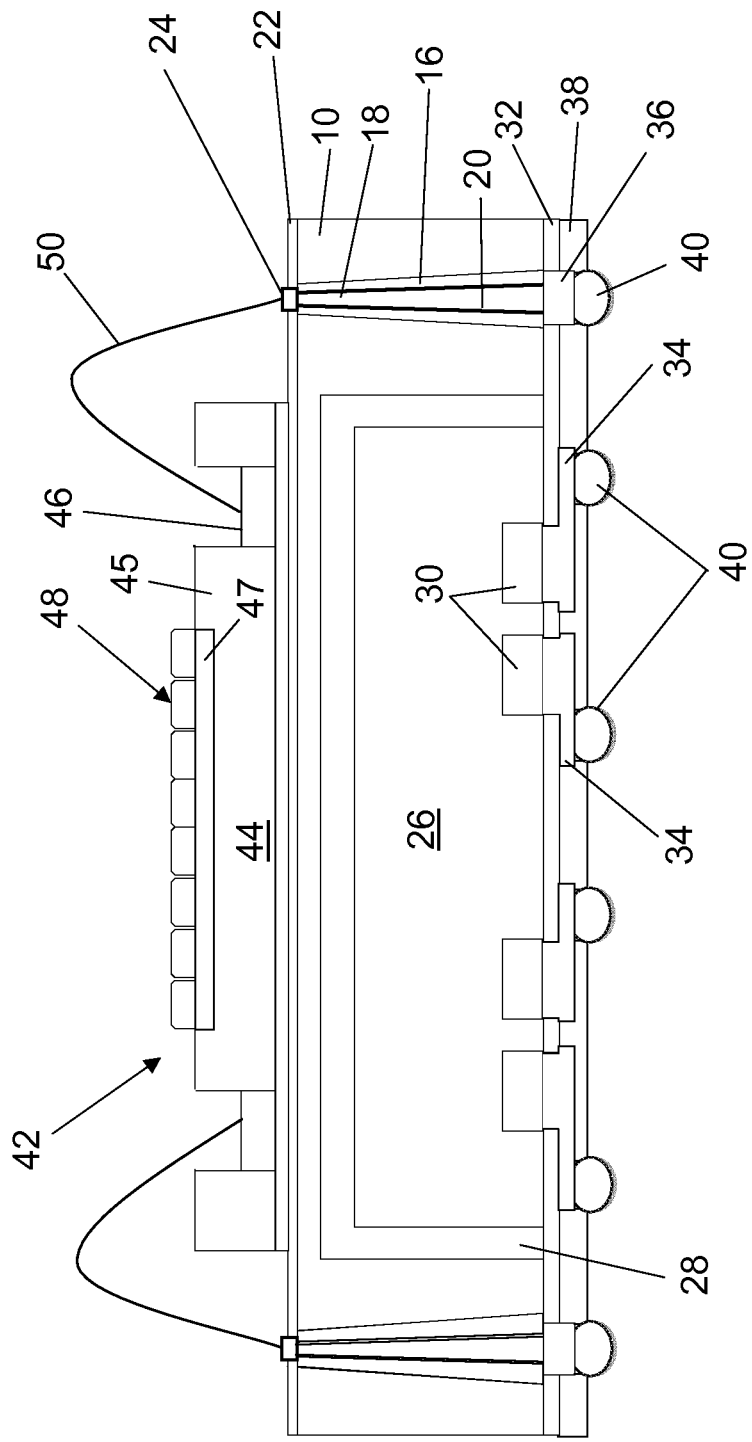

An IC chip assembly 42 is then attached onto insulation layer 22, as illustrated in FIG. 10. Attachment can be performed using conventional pick-and-place die attachment equipment. Adhesive tape or printable/dispensable epoxy materials can be used as the adhesive. The IC chip assembly 42 includes a second IC chip 44, and CIS bond pads 46 for signal connectivity to IC chip 44. In the exemplary embodiment of FIG. 10, IC chip 44 is an image sensor, which includes a substrate 45, an array of pixel sensors 47 and a color filter and microlens array 48. Ideally, IC chip 26 is a processor for the image sensor. Au or Cu wire bonds 50 are then attached to electrically connect each of the CIS bond pads to one of the interconnect metal pads 24.

The IC packaging technique and the method of its manufacture described above and illustrated in the figures have several advantages. First, the silicon based IC chip 26 is housed inside crystalline substrate 10, which provides mechanical and environmental protection of IC chip 26. Second, utilizing a compliant dielectric material 28 for securing IC chip 26 inside crystalline substrate 10 reduces thermal and mechanical stresses that could adversely affect both. Third, using a crystalline substrate package structure with fan-out and fan-in pads for packaging IC chip 26 (which can be separately tested and verified before insertion into packaging 10) enhances reliability and yield. Fourth, in a two chip combination, housing one of the chips inside a crystalline substrate package structure 10, with the other chip mounted thereon, enhances reliability and provides a signal interconnection scheme that is faster and more reliable. Fifth, electrical connections for both chips are provided on a common surface of the handler 10, for efficient signal coupling and connection. Sixth, utilizing a wafer level dielectric lamination for layer 32 provides very low impedance across a very wide frequency range. This impedance can be as much as an order of magnitude or more lower than existing spray and spin coated dielectrics. These ultra-thin dielectric laminates also offer the advantage of dampening noise on the power and ground planes and will be important for achieving acceptable electrical performance in future high speed digital designs.

There are also a number of advantages of the through-polymer-interconnect formed through holes 18. First, these interconnects are conductive elements that reliably re-route the electrical signals from chip 44, through handler 10, to the same side of handler 10 which contains the electrical contacts for the IC chip 26. Second, by forming the walls of through-holes 14 with a slant, it reduces potentially damaging inducing stress on the crystalline substrate that can result from 90 degree corners. Third, the slanted sidewalls of holes 14 also mean there are no negative angle areas that can result in gaps formed with dielectric material 16. Fourth, by forming insulation material 16 first, and then forming metallization layer 20 thereon, metal diffusion into the crystalline substrate structure of handler 10 is avoided. Fifth, forming metal layer 20 using a plating process is superior to other metallization techniques such as sputter deposition, because the plating process is less likely to damage insulation material 16. Sixth, using a compliant insulation material 16 to form the sidewalls of holes 18 is more reliable. Seventh, the creation of the through-polymer-interconnects using laser drilling through polymer, desmearing, and metal plating, is less expensive than using semiconductor sputtering and metal deposition tools. Finally, the wire bonding for the second IC chip 44 is disposed on the opposite side of the package structure 10 than the bonding pads for the first IC chip 26, which enables the shortest electrical path between chips and eliminates the need for a flexible and/or organic package handler for the assembly of the image sensor.

The packaging configuration described above is ideal for and described in the context of (but not necessarily limited to) IC chip 44 being an image sensor, and IC chip 26 being a processor for processing the signals from the image sensor. An image sensor is a complementary metal-oxide semiconductor (CMOS) device that includes an integrated circuit containing an array of pixel sensors, each pixel containing a photodetector and preferably its own active amplifier. Each pixel sensor converts the light energy to a voltage signal. Additional circuitry on the chip may be included to convert the voltage to digital data. The image processing chip comprises a combination of hardware processor(s) and software algorithms. The image processor gathers the luminance and chrominance information from the individual pixels sensors and uses it to compute/interpolate the correct color and brightness values for each pixel. The image processor evaluates the color and brightness data of a given pixel, compares them with the data from neighboring pixels and then uses a demosaicing algorithm to reconstruct a full color image from the incomplete color samples, and produces an appropriate brightness value for the pixel. The image processor also assesses the whole picture and corrects sharpness and reduce noise of the image.

The evolution of image sensors results in the ever higher pixel count in image sensors, and the additional camera functionality, such as auto focus, zoom, red eye elimination, face tracking, etc, which requires more powerful image sensor processors that can operate in higher speeds. Photographers don't want to wait for the camera's image processor to complete its job before they can carry on shooting—they don't even want to notice some processing is going on inside the camera. Therefore, image processors must be optimized to cope with more data in the same or even shorter period of time.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order separately or simultaneously that allows the proper formation of the IC packaging of the present invention. Single layers of material could be formed as multiple layers of such or similar materials, and vice versa. While the inventive packaging configuration is disclosed in the context of IC chip 26 being an image sensor processor and IC chip 44 being an image sensor, the present invention is not necessary limited to those IC chips.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a microelectronic assembly, comprising:
    forming a cavity in a crystalline substrate handler having opposing first and second surfaces, wherein the cavity is formed into the first surface that extends toward but does not reach the second surface;
    placing a first IC device in the cavity, wherein the first IC device has a bottom surface with conductive pads facing away from the second surface;
    mounting a second IC device to the second surface;
    forming a plurality of interconnects through the crystalline substrate handler, wherein each of the plurality of interconnects is formed by:
        forming a hole through the crystalline substrate handler with a sidewall extending between the first and second surfaces,
        forming a compliant dielectric material along the sidewall,
        forming a conductive material along the compliant dielectric material and extending between the first and second surfaces, wherein the compliant dielectric material insulates the conductive material from the sidewall;
    electronically coupling the second IC device to the conductive materials of the plurality of interconnects;
    forming electrical interconnects over the first surface of the handler with each electrically coupled to the conductive material of at least one of the plurality of interconnects; and
    forming electrical interconnects over the bottom surface of the first IC device with each electrically coupled to at least one of the conductive pads of the first IC device.

2. The method of claim 1, wherein the compliant dielectric material includes a polymer.

3. The method of claim 1, wherein for each of the plurality of interconnects, the hole is tapered such that the hole has a smaller cross-sectional dimension at the second surface than at the first surface.

4. The method of claim 1, wherein for each of the plurality of interconnects, the sidewall extends in a direction between 5° and 35° relative to a direction that is perpendicular to the first and second surfaces.

5. The method of claim 1, wherein the formation of each of the plurality of interconnects further comprises:
    forming a first bond pad over the hole at the first surface and electrically coupled to the conductive material; and
    forming a second bond pad over the hole at the second surface and electrically coupled to the conductive material.

6. The method of claim 5, wherein electrically coupling the second IC device to the conductive materials of the plurality of interconnects includes electrically coupling a plurality of wires between the second IC device and the second bond pads.

7. The method of claim 1, wherein the second IC device is an image sensor and the first IC device is a processor for processing signals from the image sensor.

8. A method of forming a microelectronic assembly, comprising:
    forming a cavity in a crystalline substrate handler having opposing first and second surfaces, wherein the cavity is formed into the first surface;
    placing a first IC device in the cavity, wherein the first IC device has a bottom surface with conductive pads facing away from the second surface;
    mounting a second IC device to the second surface;
    forming a plurality of interconnects through the crystalline substrate handler, wherein each of the plurality of interconnects is formed by:
        forming a hole through the crystalline substrate handler with a sidewall extending between the first and second surfaces,
        forming a compliant dielectric material along the sidewall,
        forming a conductive material along the compliant dielectric material and extending between the first and second surfaces, wherein the compliant dielectric material insulates the conductive material from the sidewall;
    electronically coupling the second IC device to the conductive materials of the plurality of interconnects;
    forming one or more layers of insulation materials on the first surface that extends across an opening of the cavity in the first surface to encapsulate the first IC device in the cavity;
    forming electrical interconnects over the first surface of the handler with each electrically coupled to the conductive material of at least one of the plurality of interconnects; and
    forming electrical interconnects over the bottom surface of the first IC device with each electrically coupled through the one or more layers of insulation materials and to at least one of the conductive pads of the first IC device.

9. The method of claim 8, wherein the forming of the electrical interconnects over the bottom surface of the first IC device comprises:
    forming a plurality of bond pads that are electrically coupled to the first IC device and extend a least partially through the one or more layers of insulation materials.

10. The method of claim 9, wherein the forming of the electrical interconnects over the bottom surface of the first IC device comprises further comprises:
    forming a plurality of rounded interconnects each electrically connected to one of the plurality bond pads.

11. A method of forming a microelectronic assembly, comprising:
    forming a cavity in a crystalline substrate handler having opposing first and second surfaces, wherein the cavity is formed into the first surface;

placing a first IC device in the cavity, wherein the first IC device has a bottom surface with conductive pads facing away from the second surface;

mounting a second IC device to the second surface;

forming a plurality of interconnects through the crystalline substrate handler, wherein each of the plurality of interconnects is formed by:

forming a hole through the crystalline substrate handler with a sidewall extending between the first and second surfaces, forming a compliant dielectric material along the sidewall, forming a conductive material along the compliant dielectric material and extending between the first and second surfaces, wherein the compliant dielectric material insulates the conductive material from the sidewall;

electronically coupling the second IC device to the conductive materials of the plurality of interconnects;

forming electrical interconnects over the first surface of the handler with each electrically coupled to the conductive material of at least one of the plurality of interconnects; and forming electrical interconnects over the bottom surface of the first IC device with each electrically coupled to at least one of the conductive pads of the IC device;

wherein the second IC device is an image sensor and the first IC device is a processor for processing signals from the image sensor;

wherein the image sensor comprises an array of pixel sensors each including a photodetector for converting light energy to a voltage signal, and wherein the processor is configured to receive the voltage signals and to compute or interpolate color and brightness values for each of the voltage signals from the pixel sensors.

\* \* \* \* \*